United States Patent
Leonard et al.

(10) Patent No.: US 12,040,355 B2
(45) Date of Patent: Jul. 16, 2024

(54) NONDESTRUCTIVE CHARACTERIZATION FOR CRYSTALLINE WAFERS

(71) Applicant: Wolfspeed, Inc., Durham, NC (US)

(72) Inventors: Robert Tyler Leonard, Raleigh, NC (US); Matthew David Conrad, Durham, NC (US); Edward Robert Van Brunt, Raleigh, NC (US)

(73) Assignee: Wolfspeed, Inc., Durham, NC (US)

( * ) Notice: Subject to any disclaimer, the term of this patent is extended or adjusted under 35 U.S.C. 154(b) by 426 days.

(21) Appl. No.: 16/750,358

(22) Filed: Jan. 23, 2020

(65) Prior Publication Data

US 2020/0365685 A1 Nov. 19, 2020

Related U.S. Application Data

(60) Provisional application No. 62/906,985, filed on Sep. 27, 2019, provisional application No. 62/849,666, filed on May 17, 2019.

(51) Int. Cl.
*H01L 29/04* (2006.01)
*C30B 23/02* (2006.01)
*H01L 21/02* (2006.01)

(52) U.S. Cl.
CPC ............ *H01L 29/04* (2013.01); *C30B 23/025* (2013.01); *H01L 21/02378* (2013.01)

(58) Field of Classification Search
CPC . H01L 21/02378; H01L 29/04; H01L 29/045; H01L 29/66053; C30B 23/025
See application file for complete search history.

(56) References Cited

U.S. PATENT DOCUMENTS

| | | |
|---|---|---|
| 4,470,875 A | 9/1984 | Poteat |
| 6,457,811 B1 | 10/2002 | Pan et al. |
| 6,977,986 B1 | 12/2005 | Beanland et al. |
| 7,314,766 B2 | 1/2008 | Sugamoto et al. |
| 7,592,616 B1 * | 9/2009 | Velidandla .............. C30B 29/36 356/237.4 |
| 9,865,046 B2 | 1/2018 | Urano et al. |

(Continued)

OTHER PUBLICATIONS

Berwian, P., et al., "Imaging Defect Luminescence of 4H-SiC by Ultraviolet-Photoluminescence," Solid State Phenomena, vol. 242, 2015, Trans Tech Publications, pp. 484-489.

(Continued)

*Primary Examiner* — Brook Kebede
(74) *Attorney, Agent, or Firm* — Sage Patent Group

(57) ABSTRACT

Nondestructive characterization of crystalline wafers is provided, including defect detection, identification, and counting. Certain aspects relate to development of nondestructive, high fidelity defect characterization and/or dislocation counting methods based on deep neural networks. Certain aspects relate to nondestructive methods for defect characterization of silicon carbide (SiC) wafers. By subjecting SiC wafers to nondestructive defect characterization, SiC wafers in their final state may be characterized and subsequently used for device fabrication, vastly reducing the expense of the characterization process. Nondestructive defect characterization also allows for increased sampling and improved feedback loops between crystalline growth process development and subsequent device production.

43 Claims, 9 Drawing Sheets

(56) References Cited

U.S. PATENT DOCUMENTS

| | | | |
|---|---|---|---|
| 2004/0071262 A1 | 4/2004 | Beanland | |
| 2004/0213376 A1 | 10/2004 | Aydelott et al. | |
| 2008/0203399 A1* | 8/2008 | Spencer | H01L 29/045 257/77 |
| 2009/0250791 A1 | 10/2009 | Afentakis et al. | |
| 2010/0142800 A1 | 6/2010 | Tung-Sing Pak et al. | |
| 2011/0242312 A1* | 10/2011 | Seki | G01N 21/9505 348/125 |
| 2014/0268121 A1 | 9/2014 | Gastaldo et al. | |
| 2015/0168311 A1* | 6/2015 | Seki | G01N 21/6489 356/51 |
| 2016/0163035 A1* | 6/2016 | Chang | G06N 3/084 382/149 |
| 2018/0211376 A1 | 7/2018 | Bedell et al. | |
| 2021/0296433 A1 | 9/2021 | Noguchi | |

OTHER PUBLICATIONS

Chen, L-C., et al., "DeepLab: Semantic Image Segmentation with Deep Convolutional Nets, Atrous Convolution, and Fully Connected CRFs," IEEE Transactions on Pattern Analysis and Machine Intelligence, 2017, IEEE, 14 pages.

Cree, "Cree to Invest $1 Billion to Expand Silicon Carbide Capacity," https://www.cree.com/news-events/news/article/cree-to-invest-1-billion-to-expand-silicon-carbide-capacity, May 7, 2019, 3 pages.

Cree, "Cree Selected as Silicon Carbide Partner for the Volkswagen Group FAST Program," https://www.cree.com/news-events/news/article/cree-selected-as-silicon-carbide-partner-for-the-volkswagen-group-fast-program, May 14, 2019, 3 pages.

Hoseini, F., et al., "An Efficient Implementation of Deep Convolutional Neural Networks for MRI Segmentation," Journal of Digital Imaging, https://doi.org/10.1007/s10278-018-0062-2, Feb. 27, 2018, Society for Imaging Informatics in Medicine 2018, 10 page.

Isola, P., et al., "Image-to-Image Translation with Conditional Adversarial Networks," 2017 IEEE Conference on Computer Vision and Pattern Recognition (CVPR), 2017, Honolulu, Hawaii, IEEE, 17 pages.

Jégou, S., et al., "The One Hundred Layers Tiramisu: Fully Convolutional DenseNets for Semantic Segmentation," 2017 IEEE Conference on Computer Vision and Pattern Recognition Workshops (CVPRW), 2017, Honolulu, Hawaii, IEEE, 9 pages.

Kadhim, M. A., et al., "Convolutional Neural Network for Satellite Image Classification," Studies in Computational Intelligence, vol. 830, 2020, Springer Nature Switzerland, pp. 165-178.

Kawahara, C., et al., "Identification of dislocations in 4H-SiC epitaxial layers and substrates using photoluminescence imaging," Japanese Journal of Applied Physics, vol. 53, 2014, The Japan Society of Applied Physics, 3 pages.

Leonard, R. T., "Exploration of Bulk and Epitaxy Defects in 4H-SiC Using Large Scale Optical Characterization," Materials Science Forum, vol. 897, 2017, Trans Tech Publications, 4 pages.

Ronneberger, O., et al., "U-Net: Convolutional Networks for Biomedical Image Segmentation," Lecture Notes in Computer Science, vol. 9351, 2015, Springer, 8 pages.

Stahlbush, R. E., "Whole-Wafer Mapping of Dislocations in 4H-SiC Epitaxy," Materials Science Forum, vols. 556-557, 2007, Trans Tech Publications, 6 pages.

Sumakeris, J. J., et al., "Dislocation Characterization in 4H-SiC Crystals," Materials Science Forum, vol. 858, 2016, Trans Tech Publications, 5 pages.

Szegedy, C., et al., "Going deeper with convolutions," EEE Conference on Computer Vision and Pattern Recognition (CVPR), Boston, Maine, 2015, IEEE, 12 page.

Tajima, M., et al., "Characterization of SiC Wafers by Photoluminescence Mapping," Materials Science Forum, vols. 527-529, 2006, Trans Tech Publications, 7 pages.

Van Brunt, E., "Performance and Reliability Impacts of Extended Epitaxial Defects on 4H-SiC Power Devices," Materials Science Forum, vol. 924, 2018, Trans Tech Publications, 6 pages.

Feng, Gan, et al., "Nonradiative recombination at threading dislocations in 4H-SiC epilayers studied by micro-photoluminescence mapping," Journal of Applied Physics, vol. 110, Issue 3, Aug. 2011, American Institute of Physics, 5 pages.

Nagano, Masahiro, et al., "Plan-View and Cross-Sectional Photoluminescence Imaging Analyses of Threading Dislocations in 4H-SiC Epilayers," Japanese Journal of Applied Physics, vol. 52, Issue 04CP09, 2013, Japan Society of Applied Physics, 5 pages.

Tajima, M., et al., "Nondestructive characterization of dislocations and micropipes in high-resistivity 6H-SiC wafers by deep-level photoluminescence mapping," Applied Physics Letters, vol. 86, Issue 6, Feb. 2005, AIP Publishing, 3 pages.

International Search Report and Written Opinion for International Patent Application No. PCT/US2020/032313, mailed Oct. 2, 2020, 24 pages.

Invitation to Pay Additional Fees and Partial Search for International Patent Application No. PCT/US2020/032313, mailed Aug. 11, 2020, 23 pages.

Non-Final Office Action for U.S. Appl. No. 16/804,776, mailed Oct. 18, 2021, 16 pages.

Notice of Allowance and Examiner-Initiated Interview Summary for U.S. Appl. No. 16/804,776, mailed Feb. 15, 2022, 10 pages.

* cited by examiner

NONDESTRUCTIVE CHARACTERIZATION FOR CRYSTALLINE WAFERS

RELATED APPLICATIONS

This application claims priority to U.S. provisional patent application Ser. No. 62/849,666, filed May 17, 2019, and to U.S. provisional patent application Ser. No. 62/906,985, filed Sep. 27, 2019, the disclosures of which are hereby incorporated herein by reference in their entirety.

FIELD OF THE DISCLOSURE

The present disclosure relates to methods for detecting and characterizing defects in crystalline wafers, and more specifically to nondestructive characterization of crystalline wafers for detecting and identifying defects.

BACKGROUND

The continuing advancement of state of the art high quality crystalline material substrates or wafers (e.g., silicon carbide (SiC) substrates or wafers) for increased device yields and manufacturing efficiency requires continual reduction in crystal defects and continual increases in wafer sizes. SiC exhibits many attractive electrical and thermophysical properties. SiC is especially useful due to its physical strength and high resistance to chemical attack as well as various electronic properties, including radiation hardness, high breakdown field, a relatively wide band gap, high saturated electron drift velocity, high temperature operation, and absorption and emission of high energy photons in the blue, violet, and ultraviolet regions of the electromagnetic spectrum. Compared with conventional wafer or substrate materials, including silicon and sapphire, such properties of SiC make it more suitable for the fabrication of wafers or substrates for high power density and high frequency solid state devices, such as power electronic, radio frequency, and optoelectronic devices.

Continuous development has led to a level of maturity in the fabrication of SiC wafers that allows such semiconductor devices to be manufactured for increasingly widespread commercial applications. The use of SiC accelerates the automotive industry's transformation to electric vehicles, enabling greater system efficiencies, while reducing cost, lowering weight and conserving space. This transformation is driven by improving the quality and size of commercially available SiC wafers. Increased device yields and manufacturing efficiency require continual reduction in extended defects.

As the semiconductor device industry continues to mature, SiC wafers having larger usable diameters are desired. Usable diameters of SiC wafers can be limited by certain structural defects in the material composition of SiC, such as dislocations (e.g., micropipes, threading, edge, basal plane, and/or screw dislocations), hexagonal voids, and stacking faults, among others. Accurate defect characterization, including a dislocation count, is essential for feedback to crystal growth technology and to provide reliable information to customers. Traditionally, defect characterization for counting dislocations or other defects in SiC wafers relies on destructive etching to reveal characteristic etch pit shapes.

Wafer etching, however, is destructive, expensive, requires corrosive chemistries, and requires constant attention to maintain a viable process. Furthermore, only a few wafers per crystal are destructively sampled, limiting the amount of information available for crystal growth process improvement.

The art continues to seek improved defect characterization techniques for crystalline materials that are capable of overcoming challenges associated with conventional techniques.

SUMMARY

Nondestructive characterization of crystalline substrates or wafers, including defect detection, identification, and counting, is disclosed. In certain embodiments, development of nondestructive, high fidelity defect characterization and/or dislocation counting methods based on modern deep convolutional neural networks (DCNN) is disclosed. As silicon carbide (SiC) wafers are subjected to nondestructive methods for defect characterization, wafers in their final state may be characterized and subsequently used for device fabrication, vastly reducing the expense of the characterization process. This not only helps to reduce the cost of SiC wafers by reclaiming the characterized SiC wafer, but also allows for increased sampling at a marginal increase in cost. As such, feedback loops between growth process development and production are accelerated.

In one aspect, a method of analyzing a SiC wafer comprises: accessing nondestructive data captured from at least a portion of the SiC wafer; detecting one or more defects in the nondestructive data; and identifying the one or more defects according to one or more defect categories based on destructive data captured from other SiC wafers. In certain embodiments, the nondestructive data comprises one or more data signals that are spatially correlated to one or more positions of the SiC wafer. In certain embodiments, the method further comprises capturing the nondestructive data. In further embodiments, capturing the nondestructive data comprises photoluminescence microscopy. In certain embodiments, the method further comprises accessing nondestructive data captured from a plurality of portions of the SiC wafer. In certain embodiments, the method further comprises detecting and identifying one or more defects in the nondestructive data in five minutes or less, or in two minutes or less, or in one minute or less.

In certain embodiments, detecting the one or more defects and identifying the one or more defects comprises supplying the nondestructive data to a deep neural network. The deep neural network may be trained by defect maps of the destructive data captured from the other SiC wafers. The destructive data is captured from etched surfaces of the other SiC wafers. In certain embodiments, the defect maps are formed by comparing the destructive data to nondestructive data of the other SiC wafers.

In certain embodiments, the one or more defect categories include one or more of dislocations, hexagonal voids, and stacking faults, among others. The dislocations may include one or more of threading dislocations, threading edge dislocations, basal plane dislocations, threading screw dislocations, screw dislocations, super screw dislocations (e.g., micropipes), and mixed dislocations. In certain embodiments, the SiC wafer comprises a 4H SiC wafer.

In certain embodiments, the method comprises detecting the absence of one or more defects from the nondestructive data. Certain embodiments relate to a system for analyzing defects according to the method. In certain embodiments, the SiC wafer comprises one or more epitaxial layers.

In another aspect, a method of analyzing crystalline defects comprises: providing a crystalline wafer that comprises a first face and a second face that opposes the first face; accessing nondestructive data captured from at least a portion of the first face; and inferring one or more predicted etch features that would be present in destructive data captured from the second face. In certain embodiments, the method further comprises inferring one or more locations of defects based on additional predicted etch features that would be present in destructive data of the first face. The one or more predicted etch features may correspond to defects in the crystalline wafer.

In certain embodiments, the crystalline wafer comprises a SiC wafer. In certain embodiments, the first face comprises a silicon face of the SiC wafer and the second face comprises a carbon face of the SiC wafer. In certain embodiments, the one or more predicted etch features correspond to threading screw dislocations that would be present in the destructive data captured from the carbon face. The method may further comprise inferring one or more locations of threading edge dislocations based on additional predicted etch features that would be present in destructive data captured from the silicon face. In certain embodiments, the crystalline wafer comprises a 4H SiC wafer.

In another aspect, a system for analyzing crystalline defects comprises: an imaging device configured to capture nondestructive data of a crystalline wafer; and a processing device configured to access the nondestructive data, detect one or more defects in the nondestructive data, and identify the one or more defects in the crystalline wafer according to one or more defect categories based on destructive data captured from other crystalline wafers. In certain embodiments, the processing device comprises a deep neural network. The imaging device may comprise a photoluminescence microscope. In certain embodiments, the one or more defect categories include one or more of dislocations, hexagonal voids, and stacking faults for SiC. The dislocations may include one or more of threading dislocations, threading edge dislocations, basal plane dislocations, threading screw dislocations, screw dislocations, and super screw dislocations. In certain embodiments, the system further comprises a wafer separation tool that is configured to separate the crystalline wafer from a bulk crystalline material.

In another aspect, a method of analyzing crystalline defects comprises: providing a SiC wafer that comprises a silicon face and a carbon face; accessing photoluminescence data captured from at least a portion of the silicon face; detecting one or more defects from the photoluminescence data; and identifying the presence or the absence of one or more threading edge dislocations in the one or more defects. In certain embodiments, the photoluminescence data comprises one or more data signals that are spatially correlated to one or more positions of the SiC wafer. In certain embodiments, the method further comprises capturing the photoluminescence data. In certain embodiments, identifying the presence or the absence of the one or more threading edge dislocations in the one or more defects comprises inferring one or more predicted etch features that would be present in destructive data captured from the carbon face. In certain embodiments, the one or more predicted etch features correspond to threading screw dislocations that would be present in the destructive data captured from the carbon face.

In another aspect, a method of analyzing SiC wafers comprises: capturing nondestructive data from at least a portion of a SiC wafer; etching one or more surfaces of the SiC wafer to delineate etch defects; correlating the delineated etch defects with the nondestructive data to form a defect map identifying one or more defects in the nondestructive data according to one or more defect categories based on the delineated etch defects; coupling the defect map to train a deep neural network; and accessing nondestructive data of other SiC wafers with the deep neural network to detect and identify one or more defects in the nondestructive data of the other SiC wafers according to the one or more defect categories. In certain embodiments, the method further comprises capturing nondestructive data from at least a portion of a plurality of SiC wafers; etching one or more surfaces of the plurality of SiC wafers to delineate etch defects; correlating the delineated etch defects with the nondestructive data to form a plurality of defect maps identifying one or more defects in the nondestructive data according to one or more defect categories based on the delineated etch defects; and coupling the plurality of defect maps to further train the deep neural network. In certain embodiments, the one or more defects in the nondestructive data of the SiC wafer comprise threading screw dislocations that are correlated with the delineated etch defects. In certain embodiments, the one or more defects in the nondestructive data further comprise threading edge dislocations.

In another aspect, a method of analyzing SiC wafers comprises: capturing nondestructive data from at least a portion of a SiC wafer; forming one or more epitaxial layers on the SiC wafer; determining one or more characteristics of the one or more epitaxial layers; correlating the one or more characteristics with the nondestructive data to form a characteristic map; coupling the characteristic map to train a deep neural network; and accessing nondestructive data of other SiC wafers with the deep neural network to infer one or more characteristics of one or more epitaxial layers that would be formed on the other SiC wafers. In certain embodiments, the one or more epitaxial layers form a device on the SiC wafer. In certain embodiments, the one or more characteristics include at least one of a defect profile, crystalline structure, bandgap, impurity level, uniformity, resistivity, or mobility of the one or more epitaxial layers.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
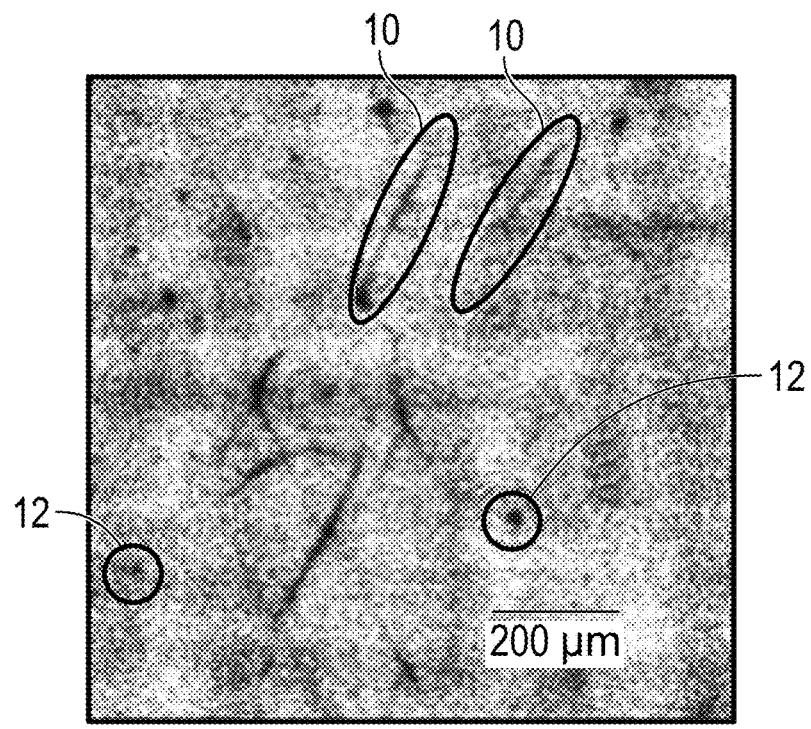
FIG. 1A is a nondestructive photoluminescence (PL) image of a portion of the silicon face (Si-face) of a 4H-silicon carbide (SiC) 4° off axis (0001) wafer.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to figures that are provided as schematic illustrations of various embodiments of the disclosure. As such, the actual thickness of the layers or elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to exclusively illustrate the precise shape of a region of a device and are not intended to limit the scope of the disclosure. Common elements between figures may be shown herein with common element numbers and may not be subsequently re-described.

Nondestructive characterization of crystalline substrates or wafers, including defect detection, identification, and counting, is disclosed. In certain embodiments, development of nondestructive, high fidelity defect characterization and/or dislocation counting methods based on modern deep convolutional neural networks (DCNNs) is disclosed. As silicon carbide (SiC) wafers are subjected to nondestructive methods for defect characterization, wafers in their final state may be characterized and subsequently used for device fabrication, vastly reducing the expense of the characterization process. This not only helps to reduce the cost of SiC wafers by reclaiming the characterized SiC wafer, but also allows for increased sampling at a marginal increase in cost. As such, feedback loops between growth process development and production are accelerated.

As used herein, a "substrate" refers to a crystalline material, such as a single crystal semiconductor material. In certain embodiments, a substrate may have sufficient thickness (i) to be surface processed (e.g., lapped and polished) to support epitaxial deposition of one or more semiconductor material layers, and optionally (ii) to be free-standing if and when separated from a rigid carrier. In certain embodiments, a substrate may have a generally cylindrical or circular shape, and/or may have a thickness of at least about one or more of the following thicknesses: 200 microns (μm), 300 μm, 350 μm, 500 μm, 750 μm, 1 millimeter (mm), 2 mm, 3 mm, 5 mm, 1 centimeter (cm), 2 cm, 5 cm, 10 cm, 20 cm, 30 cm, or more.

In certain embodiments, a substrate may include a thicker substrate that is divisible into two thinner substrates. In certain embodiments, a substrate may be part of a thicker substrate or wafer having one or more epitaxial layers (optionally in conjunction with one or more metal contacts) arranged thereon as part of a device wafer with a plurality of electrically operative devices. The device wafer may be divided in accordance with aspects of the present disclosure to yield a thinner device wafer and a second thinner wafer on which one or more epitaxial layers (optionally in conjunction with one or more metal contacts) may be subsequently formed.

In certain embodiments, a substrate may comprise a diameter of approximately 100 mm or greater, approximately 150 mm or greater, or approximately 200 mm or greater, or approximately 300 mm or greater, or approximately 450 mm or greater, or in a range including approximately 100 mm to approximately 450 mm, or in a range including approximately 150 mm to approximately 450 mm, or in a range including approximately 150 mm to approximately 300 mm, or in a range including approximately 200 mm to approximately 300 mm. With regard to relative dimensions, the term "approximately" is defined to mean a nominal dimension within a certain tolerance, such as plus or minus 5 mm from a diameter dimension. For example, as used herein, a wafer with a "200 mm" diameter may encompass a diameter range including 195 mm to 205 mm, a wafer with a "300 mm" diameter may encompass a diameter range including 295 mm to 305 mm, and a wafer with a "450 mm" diameter may encompass a diameter range including 445 mm to 455 mm. In further embodiments, such tolerances may be smaller, such as plus or minus 1 mm, or plus or minus 0.25 mm. In certain embodiments, a substrate may comprise 4H-SiC with a diameter of approximately 100 mm, 150 mm, 200 mm, or greater, and a thickness in a range of 100 to 1000 μm, or in a range of 100 to 800 μm, or in a range of 100 to 600 μm, or in a range of 150 to 500 μm, or in a range of 150 to 400 μm, or in a range of 200 to 500 μm, or in any other thickness range or having any other thickness value specified herein. In certain embodiments, the terms "substrate" and "wafer" may be used interchangeably as a wafer is typically used as a substrate for semiconductor devices that may be formed thereon. As such, a substrate or a wafer may refer to free-standing crystalline material that has been separated from a larger or bulk crystalline material or substrate.

Methods disclosed herein may be applied to substrates or wafers of various crystalline materials, of both single crystal and polycrystalline varieties.

In certain embodiments, methods disclosed herein may utilize cubic, hexagonal, and other crystal structures, and may be directed to crystalline materials having on-axis and off-axis crystallographic orientations. In certain embodiments, methods disclosed herein may be applied to semiconductor materials and/or wide bandgap materials. Exemplary materials include, but are not limited to, SiC, silicon (Si), gallium arsenide (GaAs), sapphire, and diamond. In certain embodiments, such methods may utilize single crystal semiconductor materials having hexagonal crystal structure, such as 4H-SiC, 6H-SiC, or Group III nitride materials (e.g., gallium nitride (GaN), aluminum nitride (AlN), indium nitride (InN), indium gallium nitride (InGaN), aluminum gallium nitride (AlGaN), or aluminum indium gallium nitride (AlInGaN)).

Various illustrative embodiments described hereinafter mention SiC generally or 4H-SiC specifically, but it is to be appreciated that other suitable crystalline materials may be used. Among the various SiC polytypes, the 4H-SiC polytype is particularly attractive for power electronic devices due to its high thermal conductivity, wide bandgap, and isotropic electron mobility.

Embodiments disclosed herein may apply to on-axis SiC (i.e., with no intentional angular deviation from the c-plane thereof) or off-axis SiC (i.e., typically departing from a grown axis such as the c-axis by a non-zero angle, typically in a range of from 0.5° to 10° or a subrange thereof such as 2° to 6° or another subrange). Certain embodiments disclosed herein may utilize on-axis 4H-SiC or vicinal (off-axis) 4H-SiC having an offcut in a range including 1° to 10°, or 2° to 6°, or about 2°, 4°, 6°, or 8°. Embodiments disclosed herein may apply to SiC wafers having multiple polytypes (e.g., 4H and 6H polytypes within a common SiC wafer).

Embodiments disclosed herein may also apply to both doped crystalline semiconductor materials (e.g., N-doped conductive SiC and/or P-doped SiC), co-doped, and/or undoped crystalline semiconductor materials (e.g., semi-insulating SiC or high resistivity SiC). In certain embodiments, SiC crystalline materials, including SiC boules and SiC wafers, may comprise N-type doping (including intentional and unintentional dopants such as nitrogen) with concentrations in a range including $1 \times 10^{17}$ cm$^{-3}$ to $1 \times 10^{21}$ cm$^{-3}$, or in a range including $1 \times 10^{17}$ cm$^{-3}$ to $3 \times 10^{18}$ cm$^{-3}$, or in a range from $1 \times 10^{18}$ cm$^{-3}$ to $1 \times 10^{19}$ cm$^{-3}$, or in a range from $1 \times 10^{18}$ cm$^{-3}$ to $3 \times 10^{18}$ cm$^{-3}$, among others.

In certain embodiments, N-doped SiC crystalline materials may have a resistivity in a range including 0.001 ohm-cm to 0.05 ohm-cm, or in a range including 0.001 ohm-cm to 0.03 ohm-cm, or in a range from 0.005 ohm-cm to 0.05 ohm-cm, or in a range from 0.005 ohm-cm to 0.03 ohm-cm. In other embodiments, higher resistivity SiC crystalline materials, including semi-insulating SiC boules and semi-insulating SiC wafers, may comprise unintentionally doped or undoped SiC with a resistivity of at least 1500 ohm-cm, or at least 5000 ohm-cm, or at least 50,000 ohm-cm, or at least $1 \times 10^5$ ohm-cm, or at least $1 \times 10^6$ ohm-cm, or at least $1 \times 10^9$ ohm-cm or in a range including 1500 ohm-cm to $1 \times 10^9$ ohm-cm, or in a range including $1 \times 10^5$ ohm-cm to $1 \times 10^9$ ohm-cm. Semi-insulating SiC wafers may be doped with vanadium, aluminum, or combinations thereof. Co-doped SiC wafers may comprise combinations of two or more dopants, such as nitrogen, aluminum, and vanadium, among others depending on the embodiment.

Crystalline SiC can include various structural crystal defects or extended defects, including dislocations (e.g., threading, edge, threading edge, basal plane, threading screw, screw, and/or super screw dislocations or micropipes, among others), hexagonal voids, and stacking faults, among others. Structural crystal defects may be formed during crystal growth and/or during heat-up or cooldown after growth where one or more discontinuities are formed in the material lattice structure of crystalline SiC. Such structural crystal defects can be detrimental to fabrication, proper operation, device yield, and reliability of semiconductor devices subsequently formed on SiC wafers.

Traditionally, counting extended defects in SiC is accomplished by delineating etch pits and counting them manually, or with automated microscopy tools. Etching SiC reveals features such as etch pits that can be recognized and correlated to other characterization methods such as synchrotron x-ray topography (SXRT). Wafer etching effectively destroys usable wafer area, is expensive, requires corrosive chemistries, requires constant attention to maintain a viable process, and is time consuming. As such, conventional technology for characterizing crystal defects involves destructively imaging the wafer being characterized, thereby rendering the characterized wafer useless for subsequent device fabrication. In this regard, only a few sacrificial wafers per crystal are typically sampled, which limits the amount of information available for process improvement and control. By way of example, to perform defect characterization on a SiC wafer, the carbon face (C-face) of the SiC wafer may be etched to highlight extended defects and the SiC wafer is subsequently imaged. For example, an n-type doped SiC wafer ($\sim>10^{17}$ cm$^2$) may be etched in a molten salt (KOH/EOH) before the SiC wafer is scanned and imaged for defect detection. The observed etch pits and defects are then determined for type manually, or by automated defect recognition, and counted for reporting. An optical scanner, or a manual or automatic optical microscope, may be used for defect counting from the image. For material that is not doped appropriately (low doped n-type, or insulating and p-type), this method may not work, due to insufficient delineation of defects by the etch method.

In certain embodiments as disclosed herein, defects in SiC wafers may be detected from the silicon face (Si-face) and/or the C-face without destructive steps such as etching, thereby reducing tool throughput time, counting cycle time and preserving resources. In certain embodiments, a method to detect, identify, and count defects is based on one or more combinations of automated defect detection or software to label defects, manual counting of defects (e.g., micropipes), continuously improving understanding of defect characteristics and counting, and integrating this information into a machine-learned neural network. In this manner, the machine-learned neural network may then be appropriately trained to automatically infer defects from one or more nondestructive images of a wafer. Neural networks may provide the capability to reduce high-dimensionality image data into usable defect position and labels for counting and characterization. By nondestructively detecting and identifying defects, defect characterization may be provided for the exact same substrate or wafer that a device is formed thereon, and performance characteristics of the device can be characterized based on the underlying defect structure of the wafer. From this, a better understanding of the priority of importance of defects in the wafer may be determined. In certain embodiments, the technique could be extended to pre-ink or mark areas on wafers that would fail, based on this learning. In certain embodiments, neural networks may comprise deep neural networks. As used herein, a deep neural network may include a deep convolutional neural network (DCCN), a generative adversarial network (GAN), a convolutional neural network (CNN), regions with convolutional neural network features (R-CNN), and a conditional adversarial network or the like. In certain embodiments, defect categories that may include one or more of dislocations (e.g., threading, edge, threading edge, basal plane, threading screw, screw, and/or super screw dislocations or micropipes, among others), hexagonal voids, and stacking faults, among others may be characterized from nondestructive images. In certain embodiments, defect categories may include mixed dislocations that include one or more combinations of different dislocations (e.g., threading, edge, threading edge, basal plane, threading screw, screw, and/or super screw dislocations or micropipes) that intersect with one another or terminate with one another. For example, a mixed dislocation may include a threading screw dislocation and a basal plane dislocation that intersect or terminate with one another.

Embodiments disclosed herein may allow integration of other characterization methods such as wafer topography images, cross-polarizer images and any other data that is reduced to images to be integrated into machine learning for detecting, identifying, and/or counting defects. Embodiments disclosed herein may incorporate labeling of defects, analysis from x-ray topography, and micropipe counting into training and developing neural networks. New characterization methods of defects may be integrated into the embodiments as disclosed herein. Embodiments disclosed herein may be related to a machine-learned convolutional neural network that is trained on many images that are pre-labeled.

According to embodiments disclosed herein, unetched wafers (either polished or unpolished) may be imaged with automated optical surface and photoluminescence (PL) microscopy. In certain embodiments as used herein, the terms "nondestructive data" and "nondestructive image" of a crystalline material respectively refer to data and an image that have been obtained without destroying, consuming, or otherwise damaging the crystalline material. In this regard, nondestructive data and nondestructive images may be obtained for a crystalline material on which one or more devices may subsequently be formed. For example, a spatially coordinated PL image of an unetched SiC wafer may be referred to as a nondestructive image. In contrast, the terms "destructive data" and "destructive image" refer to data or an image of a crystalline material that has been destroyed, consumed, or otherwise damaged to the point that subsequent devices may not be formed thereon. For example, any spatially coordinated image of a SiC wafer that has been etched with KOH/EOH or the like to delineate etch pits may be referred to as a destructive image. As generally used herein, data (nondestructive and destructive) that is spatially coordinated (e.g., to an x and y position of a wafer) is referred to as an image. While exemplary embodiments are provided below utilizing images of wafers, data that is not spatially coordinated may also be used. Additionally, nondestructive and destructive data and corresponding images may include one or more data signals or data channels. For example, a data signal may comprise a light emission characteristic from a crystalline defect analyzed through a light filter. Data signals may correspond to absorption signals and/or emission signals.

In certain embodiments, PL data and images may be obtained for unetched wafers that may comprise polished or unpolished surfaces. During PL microscopy, the unetched wafers may be scanned with both visible and ultra violet (UV) light and surface images and near infrared (NIR) filtered light channels are recorded. Besides NIR filtered light, any PL emission measurements may be recorded depending on the embodiment. During PL microscopy, any light source may be selected that has a suitable wavelength spectrum configured to provide PL emission of a specific material. For example, a suitable wavelength spectrum for SiC may include UV light. Any defects in the wafer are illuminated to the penetration depth of the UV light and also on the surface if present. The output of the PL images includes optically reflecting defects and UV-excited emission from defects across the wafer surface. Mapping the UV-excited PL emission in a SiC wafer may be useful to understand the distribution of defects in the SiC wafer that would underlie potential devices fabricated thereon.

While PL microscopy provides a characterization method for extended defects in epitaxial 4H-SiC and SiC wafers for characterization and mapping, the illuminated defects are near surface only, due to the small penetration depth of the UV excitation. In this manner, PL images from unetched wafers may be compared to etched images of the same wafer to provide initial information for machine learning and training to teach and build a neural network for defect characterization. With sufficient training of the neural network, PL images from other unetched wafers may be processed by the neural network to infer predicted etch features without requiring such wafers to be destructively etched. The predicted etch features may then correspond to positions and defect categories for the SiC wafers. In certain embodiments, each of the PL images may correspond with a portion of a SiC wafer and a plurality of PL images may collectively correspond to an entire surface of a particular wafer. As such, these defect categories and positions may then can be counted and summarized to indicate the overall crystalline quality of the wafer with respect to defects. In this manner, defect characterization may be provided for wafers that will be used for device fabrication.

In certain embodiments, neural networks as described herein may comprise one or more of a machine-learned CNN or a DCNN. DCCNs have typically been used to perform computer vision tasks such as image classification and object detection in a host of different contexts from cell phones to satellite images and magnetic resonance imaging (MRI). As described herein, accuracy of a DCCN for crystalline defect characterization can be attributed to the ability to build and learn a complex combination of image filters for the specific task at hand. For the DCNN to learn to correctly classify an image or locate a particular defect within an image, many annotated images are needed to achieve a result that suitably generalizes various defect features. During the training process, the DCNN receives an input image and processes it through a network of convolutional layers. For training, the parameters of the DCCN may be updated according to standard optimization techniques, including stochastic gradient descent, root mean square propagation (RMSProp), adaptive moment estimation or Adam optimization, and adaptive gradient algorithms ADAGRAD and ADADELTA. The output of the DCNN may include a probability distribution of defect categories and locations. An objective of the DCNN is to minimize the error between the predicted defect category and location and the annotated defect category and location.

In certain embodiments, a neural network is trained on many images (e.g., 6000 or more per wafer in certain embodiments) that are pre-labeled for defects from automated optical microscopy of etched images. In order to provide neural network training, images of a PL channel can be aligned with the automatic output labels of the etched wafer images that correspond to the unetched PL images for the exact same wafer. Due to the high volume of images, automating the step of identifying and counting defects in the etched images may provide more consistent counts and more accurate training of the neural network. In certain embodiments, additional network training that involves manually labeling defects may also be used to increase the accuracy of the count for network training. For example, micropipes may be manually identified and counted and such information may be provided for training of the neural network.

By way of example, 150 millimeter (mm) 4° off axis {0001} double side chemical mechanical polish (CMP) n-type 4H-SiC wafer was characterized with an automatic scanning optical microscopy equipped with PL capability. Nondestructive PL and surface images were initially acquired for both the Si-face and the C-face of the SiC wafer. Following nondestructive imaging, destructive imaging was performed for comparison purposes. Specifically, the Si-face and the C-face of the same SiC wafer were etched to delineate the etch pit defects for basal plane dislocations (BPDs), threading dislocations (TDs), and threading screw dislocations (TSDs). A NIR long pass filter was placed before the detector to discriminate the NIR PL emission. The resulting images were processed as necessary to align features on both faces of the same wafer for characterization.

Figure 1B:
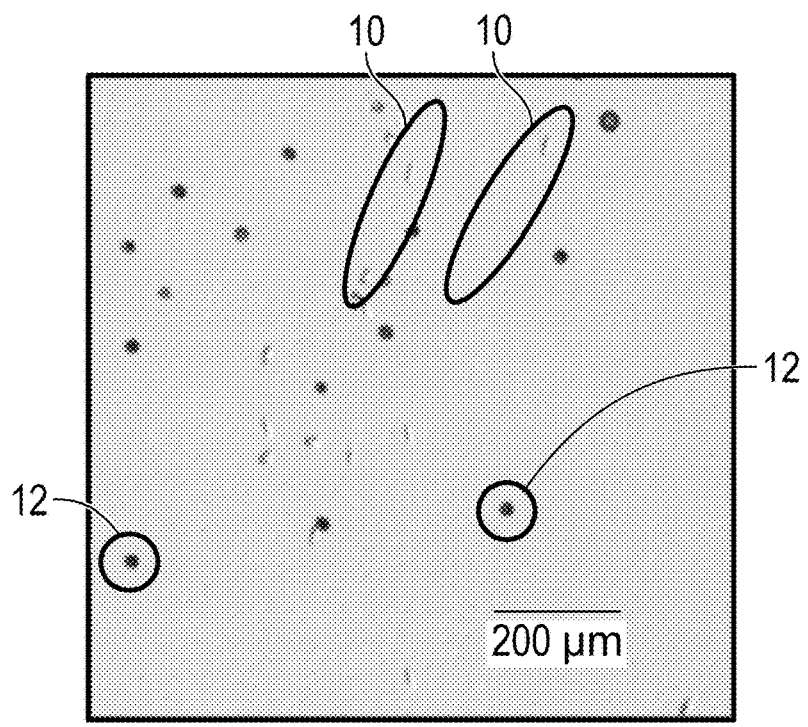
FIG. 1B is a destructive image of the same portion of the Si-face of the 4H-SiC 4° off axis (0001) wafer of FIG. 1A after etching to delineate defects.

FIG. 1 A is a nondestructive PL image of a portion of the Si-face of a 4H-SiC 4° off axis (0001) wafer. As shown, the PL image includes dark linear or elongated regions and concentrated dark spots that are scattered in a somewhat noisy background. For reference, locations of two of the dark linear regions are marked by superimposed ovals 10 and locations of two of the concentrated dark spots are marked by superimposed circles 12. Due to the penetration depth during PL, the light and dark contrast regions in the PL image correspond to possible dislocations or defects in the near surface (e.g., <10 μm) of the SiC wafer. FIG. 1B is a destructive image of the same portion of the Si-face of the 4H-SiC 4° off axis (0001) wafer of FIG. 1 A after etching to delineate defects. In FIG. 1 B, the superimposed ovals 10 and the superimposed circles 12 of FIG. 1 A are provided in the same locations for comparison. In this manner, corresponding positions of the image in FIG. 1B reveals etch pits or defects associated with the light and dark contrast regions of the PL image of FIG. 1A. By way of example, the dark linear regions of FIG. 1A correspond to scalloped shaped BPD etch pits in FIG. 1 B, and the concentrated dark spots of FIG. 1A correspond to rounded or somewhat hexagonal etch pits that may correspond to TDs, including one or more of threading edge dislocations (TEDs) or TSDs.

Figure 2A:
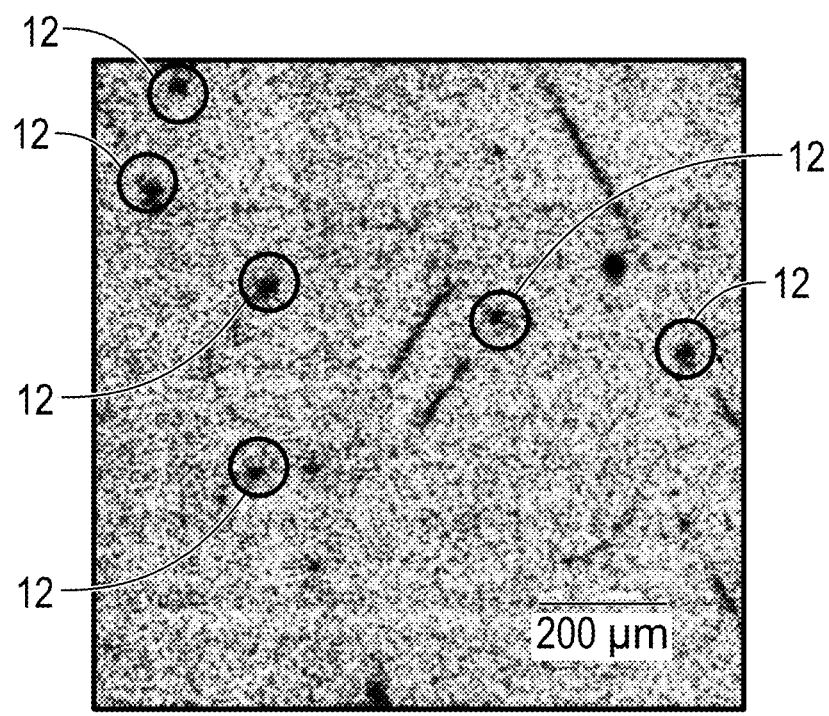
FIG. 2A is a nondestructive PL image of the 4H-SiC 4° off axis (0001) wafer of FIG. 1A taken from the carbon face (C-face) in a corresponding wafer portion.
Figure 2B:
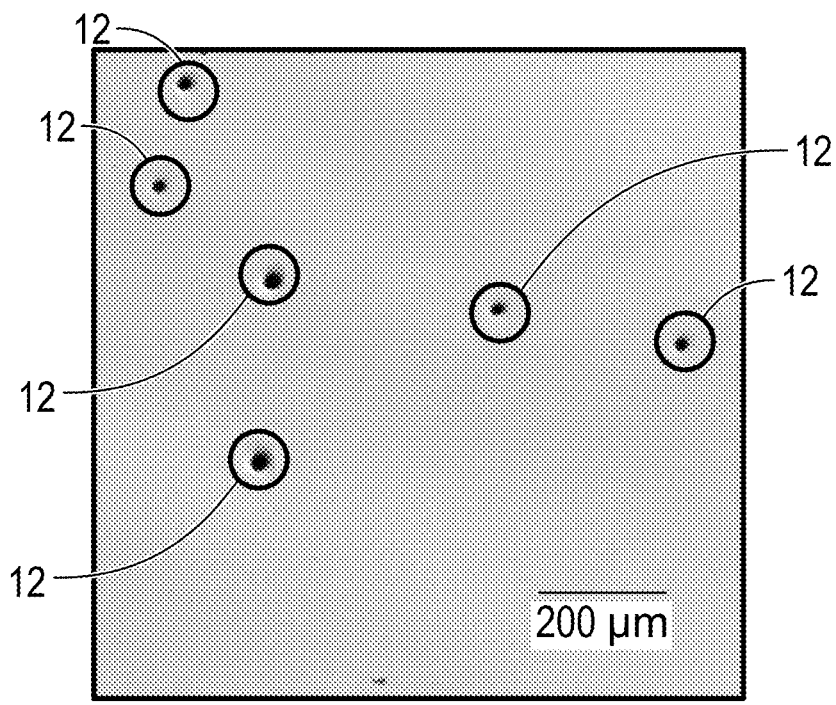
FIG. 2B is a destructive image of the same portion of the 4H-SiC 4° off axis (0001) wafer of FIG. 2A after C-face etching to delineate defects.

In certain embodiments, corresponding images of the C-face may be compared to Si-face images to further delineate crystalline defects. FIG. 2A is a nondestructive PL image of the same 4H-SiC 4° off axis (0001) wafer of FIG. 1A taken from the C-face in a corresponding wafer portion. FIG. 2B is a destructive image of the same portion of the 4H-SiC 4° off axis (0001) wafer of FIG. 2A after C-face etching to delineate defects. In FIG. 2A, six concentrated dark spots are marked with superimposed circles 12. In FIG. 2B, the superimposed circles 12 are provided to indicate the respective locations of the concentrated dark spots of FIG. 2A to provide a comparison between their unetched and etched appearance. Notably, due to differences in the etching nature between the Si-face and the C-face, not all dark spots (e.g., unmarked dark spots) in FIG. 2A correspond to dislocation pits delineated by C-face etching in FIG. 2B.

Additionally, various linear features in FIG. 2A may not correspond to etch pits or features in FIG. 2B.

As provided by the images of FIGS. 1A-2B, features that are visible from both nondestructive images (e.g., PL images of FIGS. 1A, 2A) and destructive images (e.g., etched images of FIGS. 1B, 2B) may be correlated to various crystalline defects present. For the destructive images of FIGS. 1B and 2B, the contrast for etch delineated features may be suitable for identification and categorization of defects. As such, the etch delineated features may be counted manually or with automated equipment and commercially developed algorithms. For the nondestructive images of FIGS. 1A and 2A, subtle differences in contrast between light and dark features exist throughout the images, making it more difficult to accurately and repeatedly identify and categorize defects. As disclosed herein, neural networks and machine learning are developed that are capable of identifying and categorizing defects of nondestructive images.

Figure 3A:
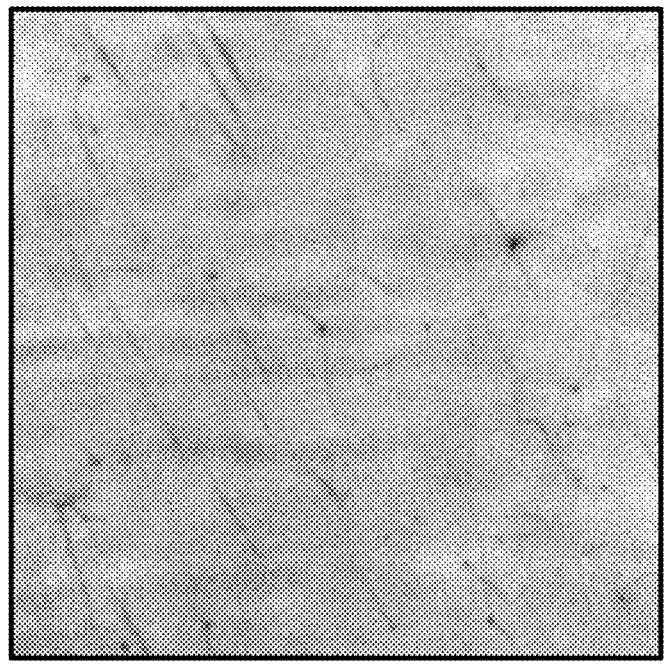
FIG. 3A is nondestructive PL image of a portion of an unetched Si-face of a SiC wafer.
Figure 3B:
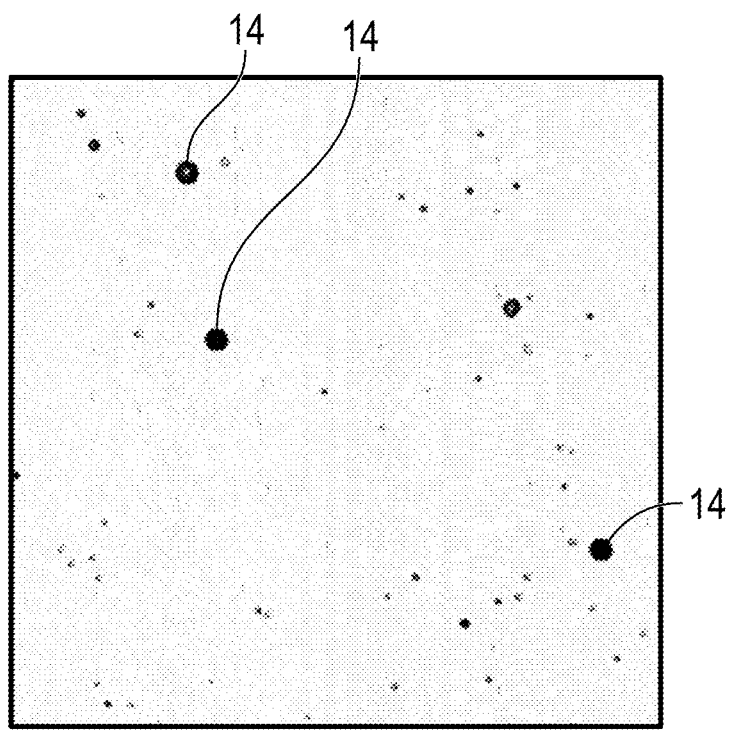
FIG. 3B is a destructive image of the same portion of the Si-face of the SiC wafer of FIG. 3A.
Figure 3C:
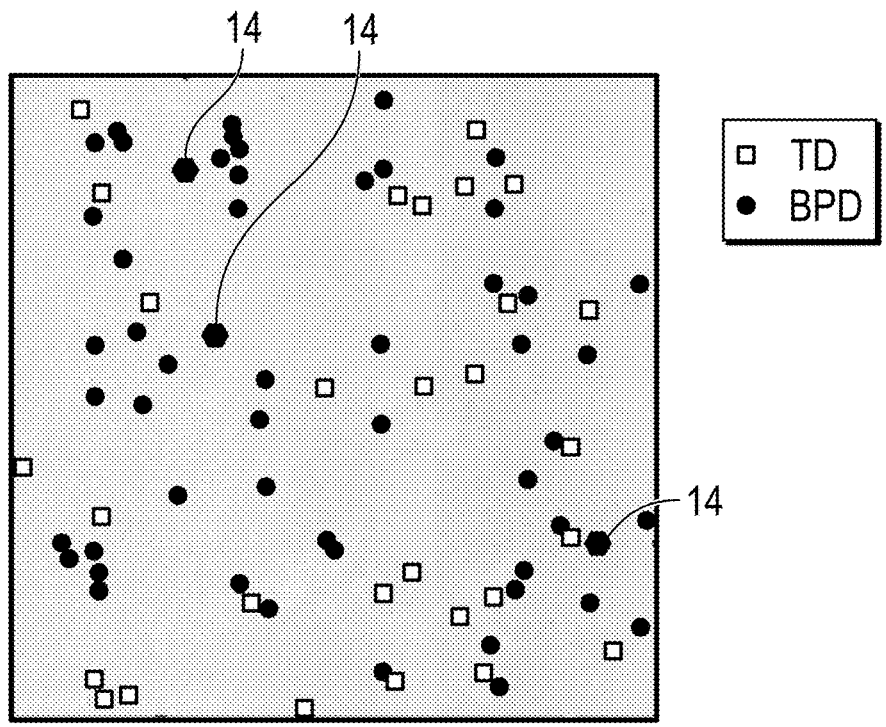
FIG. 3C is a reproduction of the image of FIG. 3B after detected etch features of FIG. 3B have been identified and labeled by category.

FIGS. 3A-3E are images of a 4H-SiC wafer at different steps in the development of a DCNN for nondestructive defect characterization of SiC wafers. FIG. 3A is nondestructive PL image of a portion of an unetched Si-face of the SiC wafer. In the nondestructive image, a variety of linear and concentrated dark regions or features are visible that may be subsequently associated with etch defects. FIG. 3B is a destructive image of the same portion of the Si-face of the SiC wafer of FIG. 3A. To provide the destructive image, the Si-face of the SiC wafer is etched in a eutectic etch bath of NaOH and KOH mixture to highlight or delineate etch defects for detection, including TDs and BPDs. FIG. 3C is a reproduction of the image of FIG. 3B after the detected etch features of FIG. 3B have been identified by category and accordingly labelled. As previously described, such categorizing and labeling may be performed by a scanning optical microscope and software or with manual labeling. By way of example, TDs are labeled with white square markers and BPDs are labeled with black circle markers in FIG. 3C. Larger black hexagonal features 14 shown in both FIGS. 3B and 3C are unlabeled defects in this example. In other embodiments, the black hexagonal features 14 may also be identified and labeled for developing the DCNN.

Figure 3D:
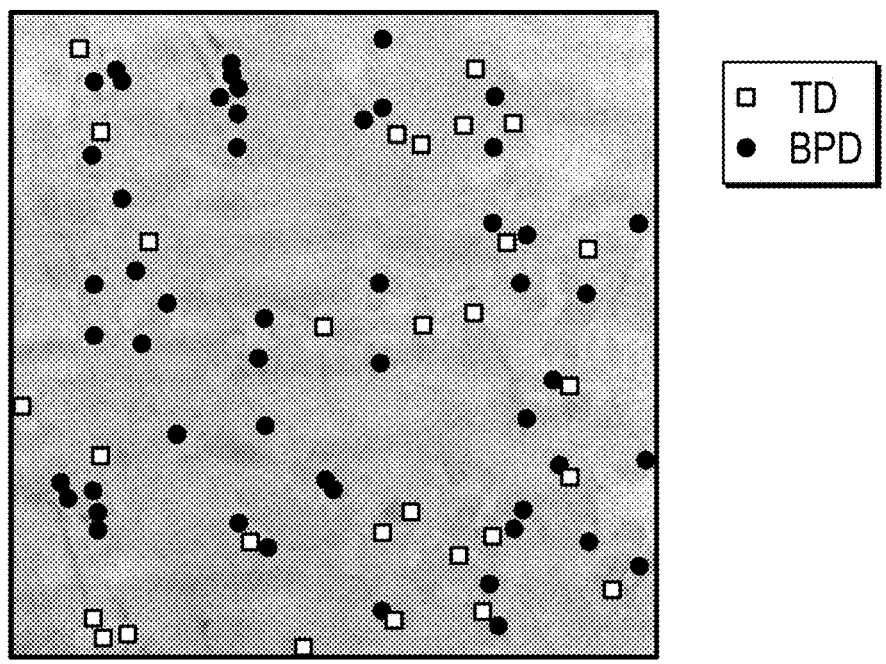
FIG. 3D is the nondestructive image of FIG. 3A overlaid with the identified and labeled markers of FIG. 3C.
Figure 3E:
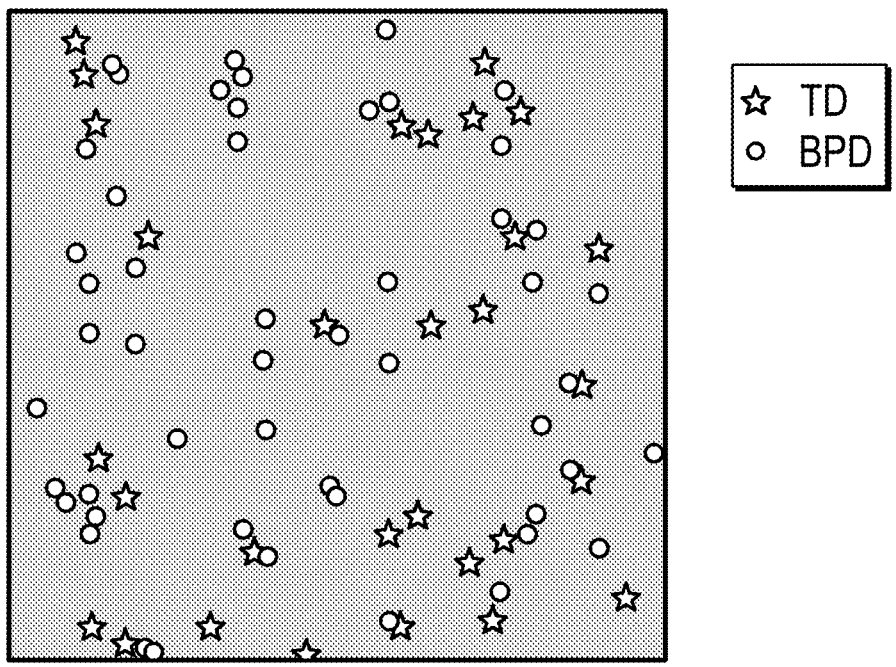
FIG. 3E represents inferred defect markers as detected and identified by a deep convolutional neural network (DCNN) over the same portion of the SiC wafer as FIG. 3A.

After detection and identification of the TDs and BPDs, the corresponding defect positions are converted to a labelling image which may be spatially aligned and compared with the nondestructive image of FIG. 3A. In this regard, FIG. 3D is the nondestructive image of FIG. 3A overlaid with the TD and BPD markers of FIG. 3C. As shown, TD and BPD locations as determined from destructive images may be correlated to various features visible in nondestructive images. Accordingly, the DCNN may be developed with any number of such images, including thousands or more, to provided improved identification of defects based on nondestructive images. Automated optical microscopy equipped with PL imaging satisfies the need for large DCNN datasets. Thousands of nondestructive images are recorded for each wafer containing many thousands of labelled defects. Once the DCNN is developed, and using nondestructive images from unetched wafers taken under similar conditions, the DCNN may be applied to infer the type and position of the defects in such nondestructive images. By way of example, FIG. 3E represents inferred TD and BPD markers as detected and identified by the DCNN over the same portion of the SiC wafer as FIG. 3A. In FIG. 3E, inferred TDs are labeled with white star markers and inferred BPDs are labeled with a white circle markers. In this regard, the inferred labels may correspond with the labels indicated in the destructive image of FIG. 3C. While FIGS. 3A-3E represent conditions for detecting defect features for the Si-face of the 4H-SiC wafer, the same process may be used to develop a same or different DCNN for detecting and identifying TSDs from the C-face, using similar images sequences. Additionally, the same or a different DCCN may also be developed to detect and identify other defects types.

In certain embodiments, a DCCN may be configured to detect and identify certain defects that are typically identified from destructive C-face images only by accessing nondestructive Si-face images of SiC wafers. For example, TSDs in SiC wafers can be difficult to identify from destructive images of the Si-face. In particular, TSDs may be difficult to distinguish from other TDs, such as TEDs, in destructive Si-face images. As such, destructive images of the C-face are typically needed to accurately identify TSDs in the crystalline material. Nondestructive PL images taken from both the C-face and the Si-face may have similar appearances of light and dark contrasting regions. In this regard, a DCNN may be developed for detection of TSDs from the Si-face by comparing a number of destructive C-face images with identified TSDs to corresponding nondestructive Si-face images. After suitable training of the DCCN on the number of images, the DCCN may accordingly be configured to detect and identify TSDs from nondestructive Si-face images of SiC wafers.

Figure 4A:
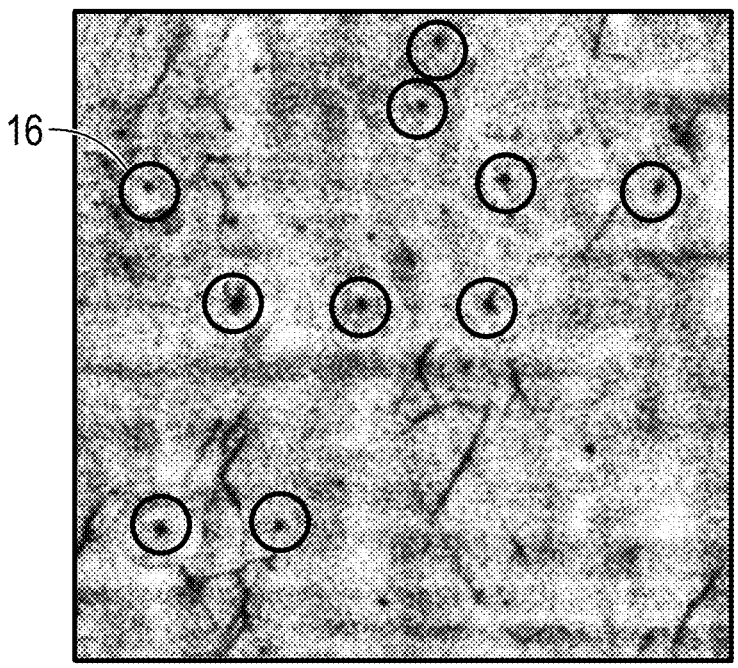
FIG. 4A is a nondestructive PL image of a portion of a 4H-SiC wafer with superimposed circles indicating locations of inferred threading screw dislocations (TSDs).
Figure 4B:
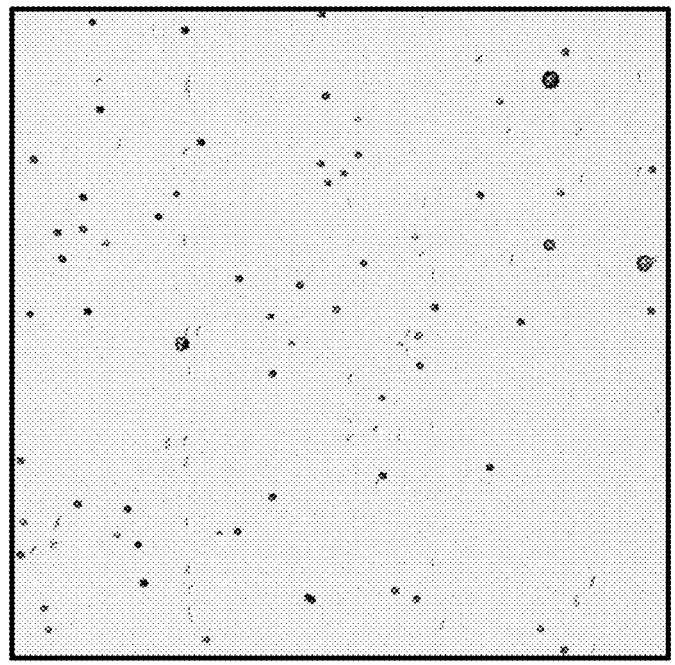
FIG. 4B is a destructively etched image of the same portion of the Si-face of the 4H-SiC wafer of FIG. 4A.
Figure 4C:
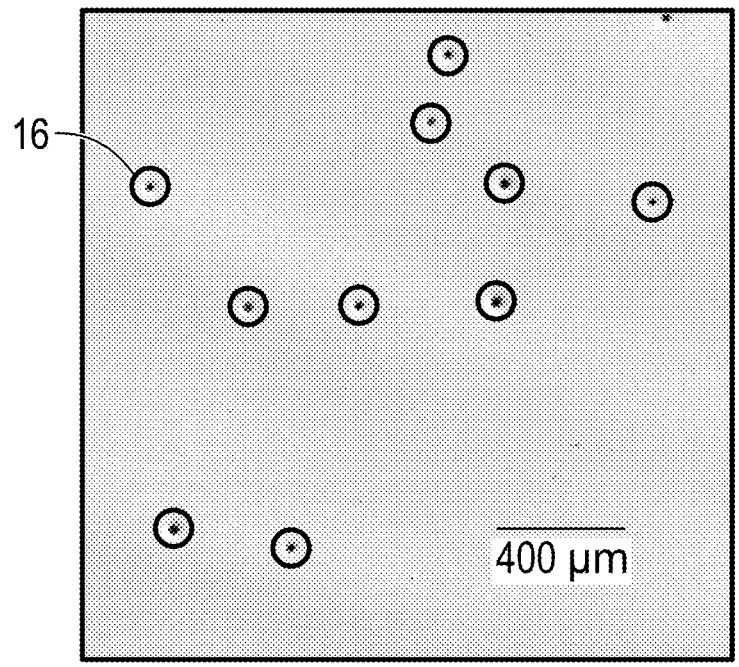
FIG. 4C is a destructively etched image of the C-face of the 4H-SiC wafer of FIGS. 4A and 4B showing TSD etch pits for comparison with the nondestructive image of FIG. 4A.

By way of example, FIGS. 4A-4C are images of a 4H-SiC wafer for comparison of TSDs detected by a DCCN from a nondestructive Si-face image to destructive Si-face and C-face images of the same SiC wafer. FIG. 4A is a nondestructive PL image of a portion of the 4H-SiC wafer. TSDs as inferred by the DCNN in the near surface Si-face PL scan are identified by dark concentrated regions, some of which are marked by superimposed dark circles 16. FIG. 4B is a destructively etched image of the same portion of the Si-face of the SiC wafer of FIG. 4A. As previously described, TSD etch features from the Si-face are not easily determined, due to multiple etch behaviors associated with TSDs on the Si-face. As shown in FIG. 4B, observed etch features of the Si-face corresponding to the PL signal provide many types of threading dislocations (e.g., TEDs and TSDs) in the same etch image, making it difficult to detect and distinguish actual positions of TEDs and TSDs. FIG. 4C is a destructively etched image of the C-face of the same SiC wafer of FIGS. 4A and 4B in a corresponding wafer portion. For comparison purposes, the image of FIG. 4C is a reversed or mirror image (e.g., x-axis reversed) of the images of FIGS. 4A and 4B. In this manner, the relative location of the crystalline material and defects therein may be oriented for alignment with the Si-face images of FIGS. 4A and 4B. In FIG. 4C, corresponding TSD etch pits reveal the same or similar defect pattern as indicated by the superimposed circles 16 in the Si-face nondestructive image of FIG. 4A. In this manner, with proper identification of TSDs based on FIG. 4C, the TSDs may be subtracted from the image of FIG. 4B to provide identification of TEDs. Accordingly, the DCNN may be developed to access nondestructive images taken from the Si-face of SiC wafers and infer both Si-face and C-face predicted etch features, such as TSDs and TEDs without requiring destructive imaging. In other embodiments, the DCNN may access nondestructive images taken from the C-face of SiC wafers and identify and detect C-face and Si-face etch features. The ability to use the DCNN to infer predicted etch features from both faces by only accessing nondestructive images from a single face allows reduced processing time for wafer imaging. In particular, to provide defect characterization for a single wafer, thousands of images may be collected for a single face, rather than having to collect thousands of images for both faces. Additionally, defect characterization may be provided on the face (e.g., Si-face or C-face) that is closest to the epi surface being used for subsequent devices formed thereon, regardless of whether the devices are formed on the C-face or the Si-face.

Figure 5:
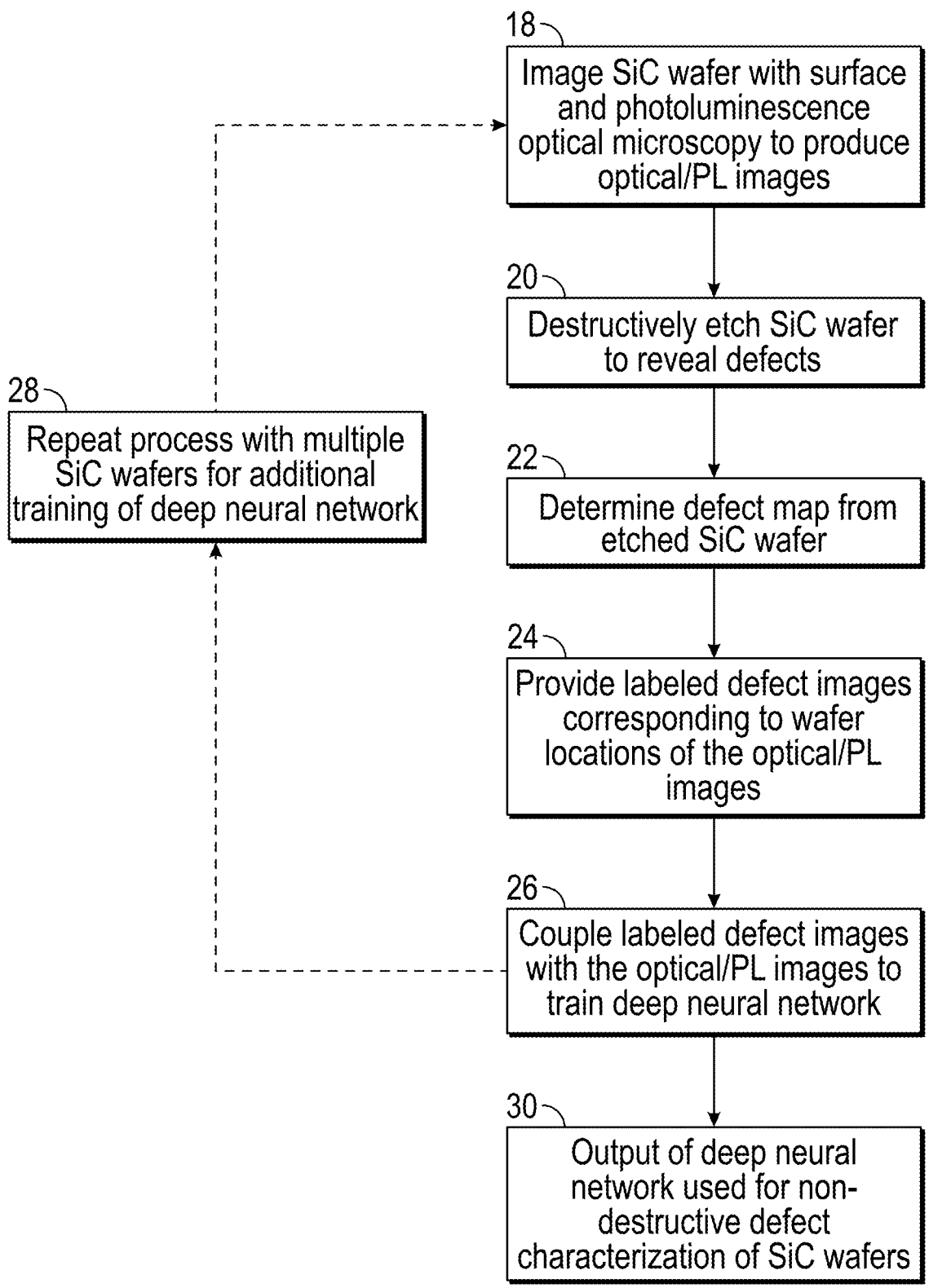
FIG. 5 represents a schematic process flow for training and development of a deep neural network according to embodiments disclosed herein.

FIG. 5 represents a schematic process flow for training and development of a deep neural network according to embodiments disclosed herein. In a first step 18, a SiC wafer is nondestructively imaged with surface and PL optical microscopy to produce one or more optical/PL images that correspond with certain wafer locations. For an entire surface of a SiC wafer, a plurality of optical/PL images may be captured. In other embodiments, the first step 18 may include capturing other nondestructive data in addition to or in place of the optical/PL images. In a second step 20, a surface (e.g., the Si-face and/or the C-face) of the same SiC wafer from the first step 18 is destructively etched to reveal or highlight defects. In a third step 22, a defect map is formed either by automatic or manual inspection of the etched surface(s) of the SiC wafer. In a fourth step 24, the defect map is used to form labeled defect images corresponding to the various wafer locations of the optical/PL images. For example, the defect locations identified in step 24 may be overlaid with the optical/PL images of step 18 for corresponding wafer locations (similar to FIG. 3D). In a fifth step 26, the labeled defect images are coupled and provided to train the deep neural network. As indicated by an optional step 28, the process may be repeated for multiple SiC wafers for additional training of the deep neural network. In step 30, the output of the deep neural network, as trained by the preceding steps, may be subsequently used for nondestructive defect characterization of SiC wafers.

Figure 6:
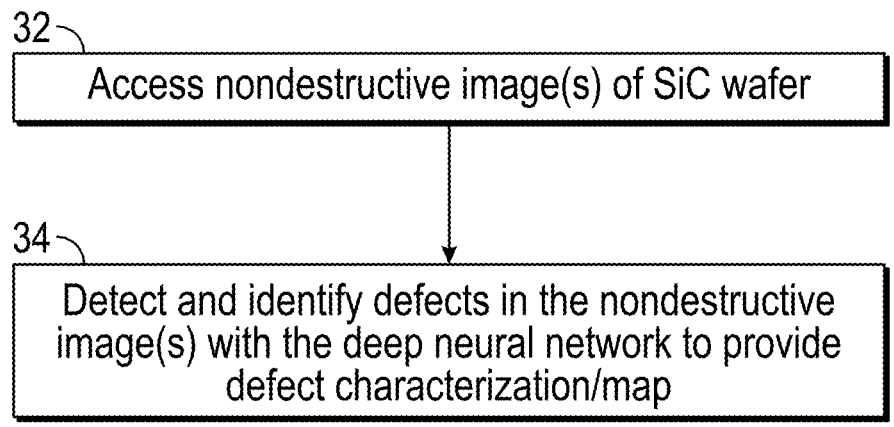
FIG. 6 represents a schematic process flow for nondestructive defect characterization of SiC wafers with a trained deep neural network.

FIG. 6 represents a schematic process flow for nondestructive defect characterization of SiC wafers with a trained deep neural network. After the deep neural network is trained and developed according to FIG. 5, SiC wafers may be nondestructively imaged with, for example, surface and PL optical microscopy. As indicated by step 32, such images may be accessed for defect characterization. In step 34, the accessed images may be processed with the deep neural network to provide defect characterization, including defect counts, locations, and maps for the SiC wafers. In this regard, once the deep neural network is trained according to FIG. 5, defect characterization for high volumes of SiC wafers may be performed without destructive etching steps associated with conventional techniques. Additionally, such defect characterization may be rapidly performed with accurate results, thereby providing faster feedback of defect information during manufacturing. In certain embodiments, defect characterization may comprise analyzing high quantities (e.g., 6000 or more) of nondestructive images/data for each wafer with a processing time of five minutes per wafer or less (e.g., 0.05 seconds per image for 6000 images), or two minutes per wafer or less (e.g., 0.02 seconds per image for 6000 images), or one minute per wafer or less (e.g., 0.01 seconds per image for 6000 images). In certain embodiments, defect analysis and characterization may also be performed on SiC wafers where one or more epitaxial layers have been subsequently formed. In this manner, nondestructive data and images of SiC wafers with epitaxial layers and/or devices may be collected and analyzed according to the deep neural network that is trained on destructive data and images as previously described.

While optical/PL imaging are disclosed as examples of nondestructive imaging, other nondestructive topography imaging, such as x-ray topography, may be utilized with the same process to provide topography images to the neural network for network training. In this regard, embodiments are disclosed that provide a way to monitor the correctness of counting methods based on synchrotron accepted standards and expertise. Embodiments as disclosed herein may also be configured as a tool that provides accepted counting methodology and defect characterization for SiC wafers.

Figure 7:
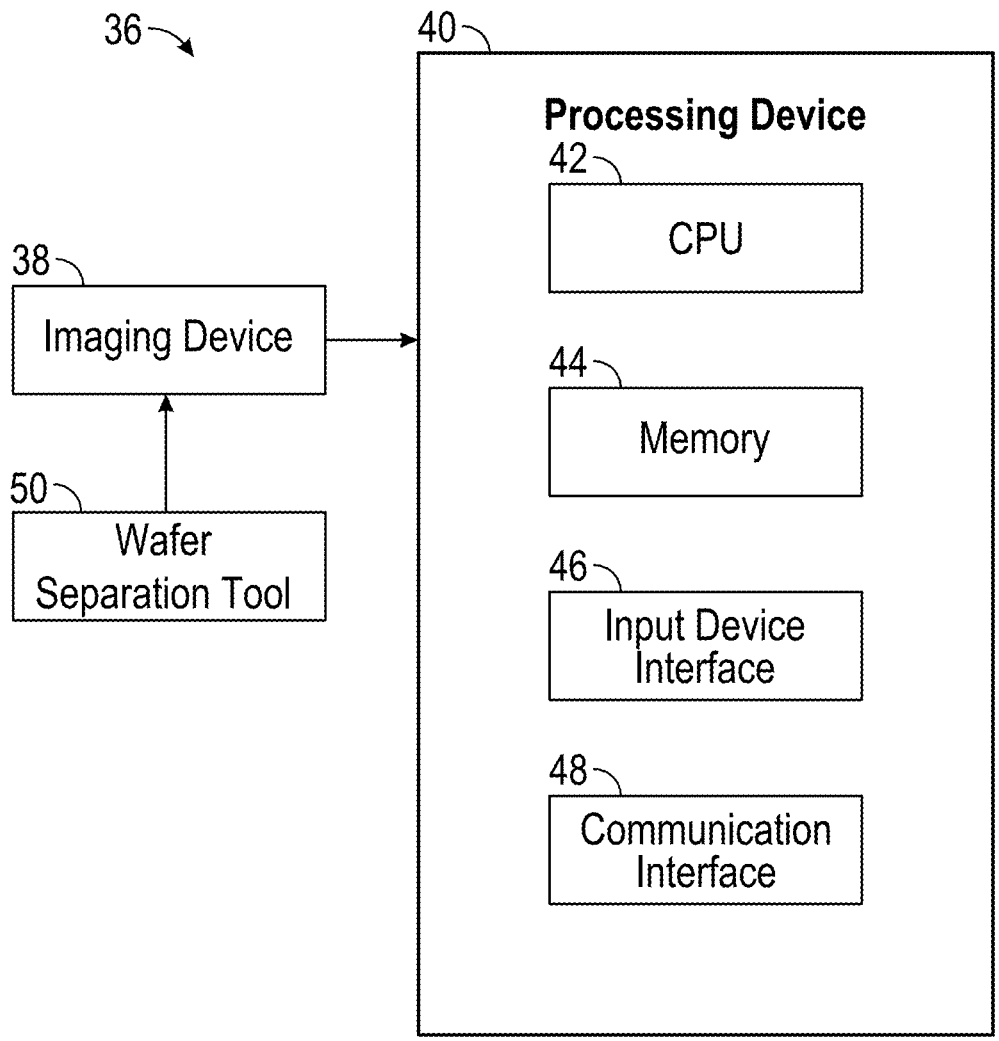
FIG. 7 is a schematic illustration of an exemplary characterization system according to embodiments disclosed herein.

FIG. 7 is a schematic illustration of an exemplary characterization system 36 according to embodiments disclosed herein. As illustrated, an imaging device 38, such as an automated optical surface and PL microscope, is provided to capture nondestructive images of SiC wafers. The nondestructive images may then be processed by a processing device 40, which may include a central processing unit (CPU) 42 and/or memory 44 configured to analyze the nondestructive images for defect characterization according to a trained deep neural network as described for FIG. 5. The CPU 42 may comprise multiple cores, multiple nodes, and/or multiple workstations working together. Additionally, a graphics processing unit (GPU), multiple GPUs, and/or multiple GPUs on different work stations may be used with CPU 42 to more rapidly process information. In certain embodiments, the nondestructive images may be stored separately from the processing device 40. For example, the nondestructive images may be stored on a server from which the processing device 40 has access to. In other embodiments, one or more of the nondestructive images may be stored directly in the processing device 40. The processing device 40 and/or the CPU 42 may comprise any computing or electronic device capable of including firmware, hardware, and/or executing software instructions to implement the functionality described herein, such as a computer server, a desktop computing device, a laptop computing device, a smartphone, a computing tablet, or the like. The memory 44 may include non-volatile memory and volatile memory. The non-volatile memory may include read-only memory (ROM), erasable programmable read-only memory (EPROM), electrically erasable programmable read-only memory (EEPROM), and the like. The volatile memory generally includes random-access memory (RAM). A basic input/output system (BIOS) may be stored in the non-volatile memory and can include the basic routines that help to transfer information between elements within the processing device 40.

The processing device 40 may further include or be coupled to a non-transitory computer-readable storage medium, such as a storage device, which may represent an internal or external hard disk drive (HDD), flash memory, or the like. The storage device and other drives associated with computer-readable media and computer-usable media may provide non-volatile storage of data, data structures, computer-executable instructions, and the like. Although the description of computer-readable media above refers to an HDD, it should be appreciated that other types of media that are readable by a computer, such as optical disks, magnetic cassettes, flash memory cards, cartridges, and the like, may also be used in the operating environment, and, further, that any such media may contain computer-executable instructions for performing novel methods of the disclosed embodiments.

An operating system and any number of applications can be stored in the volatile memory, wherein the applications represent a wide array of computer-executable instructions corresponding to programs, applications, functions, and the like that may implement the functionality of defect characterization as described herein in whole or in part. The applications may also reside on the storage mechanism provided by the storage device. As such, all or a portion of the functionality described herein may be implemented as a computer program product stored on a transitory or non-transitory computer-usable or computer-readable storage medium, such as the storage device, volatile memory, non-volatile memory, and the like. The computer program product includes complex programming instructions, such as complex computer-readable program code, to cause the processing device 40 to carry out the steps necessary to implement the defect characterization functions described herein. The processing device 40, may serve as a controller or control system to implement the functionality described herein based on the computer program product.

An operator, such as a user, may also be able to enter one or more configuration commands through a keyboard, a pointing device such as a mouse, or a touch-sensitive surface, such as a display device, via an input device interface 46 or remotely through a web interface, terminal program, or the like via a communication interface 48. The display device, which is coupled to a system bus, may be driven via a video port. The communication interface 48 may be wired or wireless and facilitate communications with any number of devices via the communication network in a direct or indirect fashion.

As further illustrated in FIG. 7, the characterization system 36 may optionally be integrated with additional equipment that provide other capabilities related to crystalline wafer manufacturing. For example, the additional equipment may include a wafer separation tool 50 that is configured to separate one or more crystalline wafers from a bulk crystalline material (e.g., SiC wafers from a SiC boule). In this manner, each crystalline wafer may be analyzed for defects according to embodiments disclosed herein right after separation. In certain embodiments, the wafer separation tool 50 comprises a wire saw tool or a laser-assisted separation tool. The wafer separation tool 50 may be built-in with one or more of the imaging device 38 and the processing device 40.

According to aspects disclosed herein, nondestructive, fast and accurate extended defect characterization for crystalline wafers, such as large diameter SiC wafers, is provided. Nondestructive PL image signals from extended defects on 4H-SiC wafers may be correlated to specific etch features of BPDs, TSDs, and TEDs, among others for development of one or more neural networks, such as a DCNNs. To train and develop DCNNs, large volume data sets may be used from selective etch methods of 4H-SiC substrates as correlated with established techniques such as SXRT. Once sufficient training is complete, destructive methods may no longer be needed to characterize extended defects in 4H-SiC substrates. In certain aspects, using nondestructive images of unetched wafers coupled with automatically labelled images of the corresponding etched wafers, DCNNs may be trained to infer the position of the defects only from the nondestructive images, regardless of the wafer face that is imaged.

Techniques described herein may also be applied for analyzing or characterizing wafers that include one or more epitaxial layers or devices formed thereon. To train a deep neural network in this manner, one or more characteristics of epitaxial layers or devices formed on a wafer may be correlated with nondestructive data and images captured from the wafer before the epitaxial layers or devices are formed. With enough training, one or more characteristics of epitaxial layers or devices may be inferred from nondestructive data and images of bare wafers, thereby providing predictive information useful for selecting certain wafers for specific applications.

Figure 8:
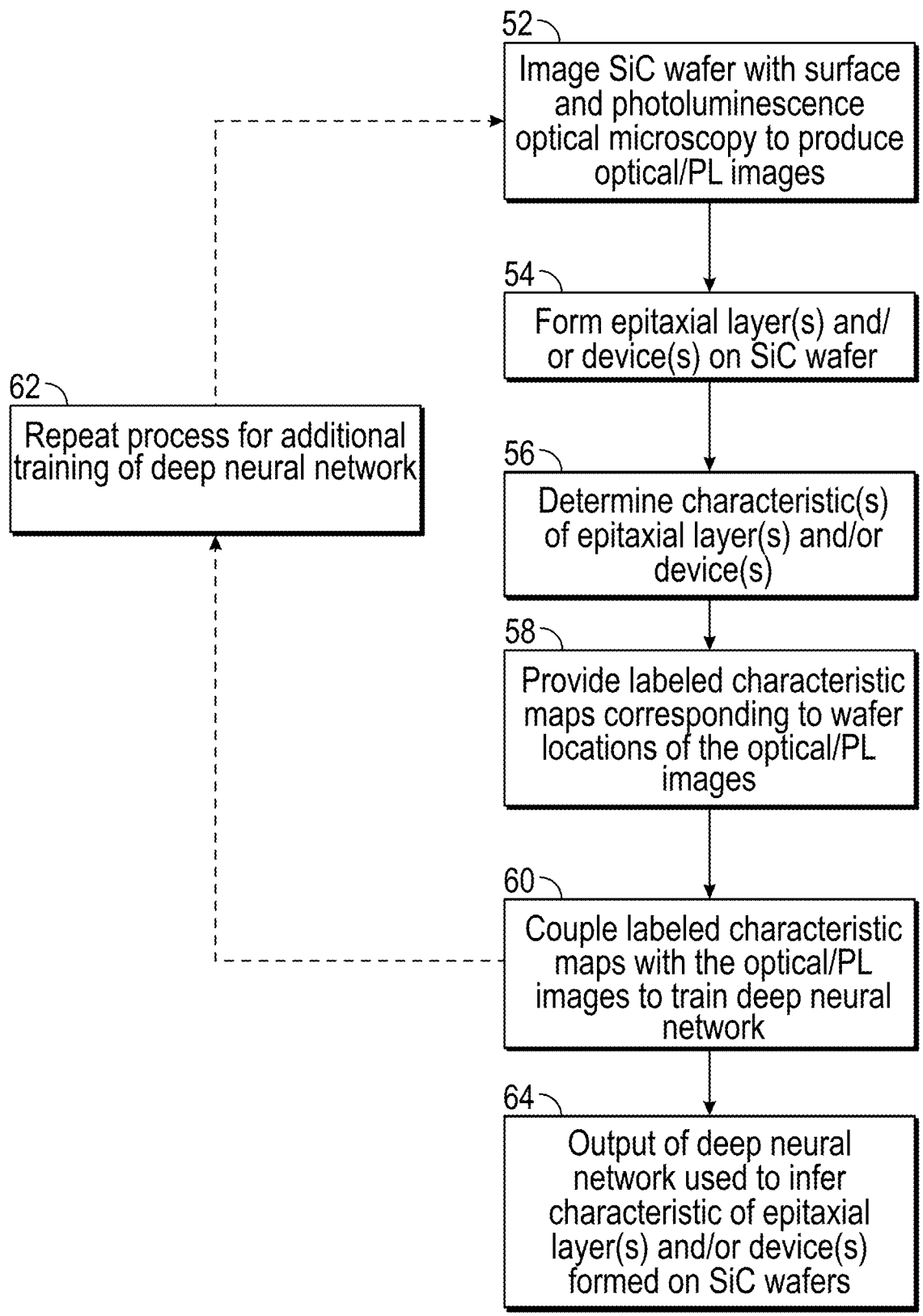
FIG. 8 represents a schematic process flow for training and development of a deep neural network to infer characteristics of epitaxial layers and/or devices by analyzing nondestructive data of bare SiC wafers.

FIG. 8 represents a schematic process flow for training and development of a deep neural network to infer characteristics of epitaxial layers and/or devices by analyzing nondestructive data of bare SiC wafers. In a first step 52, a SiC wafer is nondestructively imaged with surface and PL optical microscopy to produce one or more optical/PL images that correspond with certain wafer locations. For an entire surface of a SiC wafer, a plurality of optical/PL images may be captured. In certain embodiments, one or both of the Si-face and the C-face of the SiC wafer may be imaged. In other embodiments, the first step 52 may include capturing other nondestructive data in addition to or in place of the optical/PL images. In a second step 54, one or more epitaxial layers and/or one or more devices are formed on the SiC wafer. In a third step 56, one or more characteristics of the epitaxial layers and/or devices are determined. In certain embodiments, the one or more characteristics may include capturing optical/PL images of the epitaxial layers and/or devices to provide one or more of a defect profile, crystalline structure, bandgap, impurity level, and uniformity measurements, among others. The one or more characteristics may also include determining other characteristics of the epitaxial layers and/or devices such as resistivity and mobility measurements. In a fourth step 58, the one or more characteristics are used to form labeled characteristic images or maps corresponding to the various wafer locations of the optical/PL images provided in the first step 52. In a fifth step 60, the labeled characteristic images or maps are coupled and provided to train the deep neural network. As indicated by an optional step 62, the process may be repeated for multiple SiC wafers for additional training of the deep neural network. In step 64, the output of the deep neural network, as trained by the preceding steps, may be subsequently used to infer characteristics of epitaxial layers and/or devices by analyzing nondestructive data of bare SiC wafers.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A method of analyzing a silicon carbide (SiC) wafer comprising:
   accessing nondestructive data captured from at least a portion of the SiC wafer;
   detecting one or more defects in the nondestructive data; and
   identifying the one or more defects based on destructive data captured from other SiC wafers, wherein the destructive data are obtained using destructive characterization steps that are destructive to the other SiC wafers.

2. The method of claim 1, wherein the nondestructive data comprises one or more data signals that are spatially correlated to one or more positions of the SiC wafer.

3. The method of claim 1, further comprising capturing the nondestructive data.

4. The method of claim 3, wherein said capturing the nondestructive data comprises photoluminescence microscopy.

5. The method of claim 1, further comprising accessing nondestructive data captured from a plurality of portions of the SiC wafer.

6. The method of claim 5, further comprising detecting and identifying one or more defects in the nondestructive data in five minutes or less.

7. The method of claim 5, further comprising detecting and identifying one or more defects in the nondestructive data in two minutes or less.

8. The method of claim 5, further comprising detecting and identifying one or more defects in the nondestructive data in one minute or less.

9. The method of claim 1, wherein said detecting the one or more defects and identifying the one or more defects comprises supplying the nondestructive data to a deep neural network.

10. The method of claim 9, wherein the deep neural network is trained by defect maps of the destructive data captured from the other SiC wafers.

11. The method of claim 10, wherein the destructive data is captured from etched surfaces of the other SiC wafers.

12. The method of claim 10, wherein the defect maps are formed by comparing the destructive data to nondestructive data of the other SiC wafers.

13. The method of claim 1, further comprising classifying the one or more defects into one or more defect categories based on the destructive data, wherein the one or more defect categories include one or more of dislocations, hexagonal voids, and stacking faults.

14. The method of claim 13, wherein the dislocations include one or more of threading dislocations, threading edge dislocations, basal plane dislocations, threading screw dislocations, screw dislocations, super screw dislocations, and mixed dislocations.

15. The method of claim 1, wherein the SiC wafer comprises a 4H SiC wafer.

16. The method of claim 1, further comprising detecting the absence of one or more defects from the nondestructive data.

17. The method of claim 1, wherein the SiC wafer comprises one or more epitaxial layers.

18. A system for analyzing defects according to the method of claim 1.

19. A method of analyzing crystalline defects comprising:
providing a crystalline wafer that comprises a first face and a second face that opposes the first face;
accessing nondestructive data captured from at least a portion of the first face; and
inferring one or more predicted etch features that would be present in destructive data captured from the second face, wherein the one or more predicted etch features correspond to defects in the crystalline wafer.

20. The method of claim 19, further comprising inferring one or more locations of defects based on additional predicted etch features that would be present in destructive data of the first face.

21. The method of claim 19, wherein the crystalline wafer comprises a silicon carbide (SiC) wafer.

22. The method of claim 21, wherein the first face comprises a silicon face of the SiC wafer and the second face comprises a carbon face of the SiC wafer.

23. The method of claim 22, wherein the one or more predicted etch features correspond to threading screw dislocations that would be present in the destructive data captured from the carbon face.

24. The method of claim 23, further comprising inferring one or more locations of threading edge dislocations based on additional predicted etch features that would be present in destructive data captured from the silicon face.

25. The method of claim 19, wherein the crystalline wafer comprises a 4H SiC wafer.

26. A system for analyzing crystalline defects, the system comprising:
an imaging device configured to capture nondestructive data of a crystalline wafer; and
a processing device configured to access the nondestructive data, detect one or more defects in the nondestructive data, and identify the one or more defects in the crystalline wafer based on destructive data captured from other crystalline wafers, wherein the destructive data are obtained using destructive characterization steps.

27. The system of claim 26, wherein the processing device comprises a deep neural network.

28. The system of claim 26, wherein the imaging device comprises a photoluminescence microscope.

29. The system of claim 26, wherein the processing device classifies the one or more defects into one or more defect categories based on the destructive data, wherein the one or more defect categories include one or more of dislocations, hexagonal voids, and stacking faults for silicon carbide.

30. The system of claim 29, wherein the dislocations include one or more of threading dislocations, threading edge dislocations, basal plane dislocations, threading screw dislocations, screw dislocations, super screw dislocations, and mixed dislocations.

31. The system of claim 26, further comprising a wafer separation tool that is configured to separate the crystalline wafer from a bulk crystalline material.

32. A method of analyzing crystalline defects comprising:
providing a silicon carbide (SiC) wafer that comprises a silicon face and a carbon face;
accessing photoluminescence data captured from at least a portion of the silicon face;
detecting one or more defects from the photoluminescence data; and
identifying the presence or the absence of one or more threading edge dislocations in the one or more defects based on destructive data captured from other SiC wafers, wherein the destructive data are obtained using destructive characterization steps.

33. The method of claim 32, wherein the photoluminescence data comprises one or more data signals that are spatially correlated to one or more positions of the SiC wafer.

34. The method of claim 32, further comprising capturing the photoluminescence data.

35. The method of claim 32, wherein identifying the presence or the absence of the one or more threading edge dislocations in the one or more defects comprises inferring one or more predicted etch features that would be present in destructive data captured from the carbon face.

36. The method of claim 32, wherein the one or more predicted etch features correspond to threading screw dislocations that would be present in the destructive data captured from the carbon face.

37. A method of analyzing silicon carbide (SiC) wafers comprising:
capturing nondestructive data from at least a portion of a SiC wafer;

etching one or more surfaces of the SiC wafer to delineate etch defects;

correlating the delineated etch defects with the nondestructive data to form a defect map identifying one or more defects in the nondestructive data according to one or more defect categories based on the delineated etch defects;

coupling the defect map to train a deep neural network; and accessing nondestructive data of other SiC wafers with the deep neural network to detect and identify one or more defects in the nondestructive data of the other SiC wafers according to the one or more defect categories.

38. The method of claim 37, further comprising:

capturing nondestructive data from at least a portion of a plurality of SiC wafers;

etching one or more surfaces of the plurality of SiC wafers to delineate etch defects;

correlating the delineated etch defects with the nondestructive data to form a plurality of defect maps identifying one or more defects in the nondestructive data according to one or more defect categories based on the delineated etch defects; and coupling the plurality of defect maps to further train the deep neural network.

39. The method of claim 37, wherein the one or more defects in the nondestructive data of the SiC wafer comprise threading screw dislocations that are correlated with the delineated etch defects.

40. The method of claim 39, wherein the one or more defects in the nondestructive data further comprise threading edge dislocations.

41. A method of analyzing silicon carbide (SiC) wafers comprising:

capturing nondestructive data from at least a portion of a SiC wafer;

forming one or more epitaxial layers on the SiC wafer;

determining one or more characteristics of the one or more epitaxial layers;

correlating the one or more characteristics with the nondestructive data to form a characteristic map;

coupling the characteristic map to train a deep neural network; and accessing nondestructive data of other SiC wafers with the deep neural network to infer one or more characteristics of one or more epitaxial layers that would be formed on the other SiC wafers.

42. The method of claim 41, wherein the one or more epitaxial layers form a device on the SiC wafer.

43. The method of claim 41, wherein the one or more characteristics include at least one of a defect profile, crystalline structure, bandgap, impurity level, uniformity, resistivity, or mobility of the one or more epitaxial layers.

* * * * *